United States Patent
Kim et al.

(10) Patent No.: US 9,896,590 B2
(45) Date of Patent: Feb. 20, 2018

(54) CONDUCTIVE POLYMER INK COMPOSITION

(71) Applicant: LG CHEM, LTD., Seoul (KR)

(72) Inventors: Mi-Kyoung Kim, Daejeon (KR); Yu-Jin Woo, Daejeon (KR); Jae-Hyun Yoo, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 15/313,862

(22) PCT Filed: May 26, 2015

(86) PCT No.: PCT/KR2015/005242
§ 371 (c)(1),
(2) Date: Nov. 23, 2016

(87) PCT Pub. No.: WO2015/182954
PCT Pub. Date: Dec. 3, 2015

(65) Prior Publication Data
US 2017/0198160 A1    Jul. 13, 2017

(30) Foreign Application Priority Data

May 27, 2014  (KR) .................. 10-2014-0063799
May 22, 2015  (KR) .................. 10-2015-0071741

(51) Int. Cl.
| | | |
|---|---|---|
| H01B 1/00 | (2006.01) |
| C09D 11/52 | (2014.01) |
| C09D 11/38 | (2014.01) |
| C09D 11/106 | (2014.01) |
| C09D 11/102 | (2014.01) |
| C09D 11/033 | (2014.01) |
| H01L 51/00 | (2006.01) |

(Continued)

(52) U.S. Cl.
CPC ............ *C09D 11/52* (2013.01); *C09D 11/033* (2013.01); *C09D 11/102* (2013.01); *C09D 11/106* (2013.01); *C09D 11/38* (2013.01); *H01B 1/127* (2013.01); *H01L 51/004* (2013.01); *H01L 51/0022* (2013.01); *H01L 51/0037* (2013.01); *H01L 51/442* (2013.01)

(58) Field of Classification Search
CPC ........... H01B 1/00; H01B 1/127; H01L 35/24; C09D 5/24; C09D 11/52
See application file for complete search history.

(56) References Cited

U.S. PATENT DOCUMENTS

2016/0196892 A1* 7/2016 Ohori .................. H01B 1/127
345/173

FOREIGN PATENT DOCUMENTS

KR       1997-001404 B1    2/1997
KR   10-2010-0007269 A    1/2010
(Continued)

*Primary Examiner* — Mark Kopec
(74) *Attorney, Agent, or Firm* — Dentons US LLP

(57) ABSTRACT

This invention relates to a conductive polymeric ink composition, including 1) a PEDOT:PSS aqueous dispersion, 2) dimethyl sulfoxide, 3) a solvent, 4) a surfactant, and 5) a phosphate compound represented by Chemical Formula 1, and to a transparent electrode formed using the same. The use of this ink composition enables the formation of a conductive polymer thin film having superior coatability or processability, including jetting capability and spreadability on a substrate, and high transmittance and conductivity.

14 Claims, 2 Drawing Sheets

(51) Int. Cl.
*H01L 51/44* (2006.01)
*H01B 1/12* (2006.01)

(56) References Cited

FOREIGN PATENT DOCUMENTS

| | | |
|---|---|---|
| KR | 10-1067344 B1 | 9/2011 |
| KR | 10-2012-0016377 A | 2/2012 |
| KR | 10-2014-0012509 A | 2/2014 |
| WO | 2011/142558 A2 | 11/2011 |
| WO | 2013/169087 A1 | 11/2013 |

* cited by examiner

CONDUCTIVE POLYMER INK COMPOSITION

CROSS REFERENCES TO RELATED APPLICATION

This application is the National Stage Entry of International Application No. PCT/KR2015/005242 filed May 26, 2015 and claims the benefit of Korean Patent Application Nos. KR 10-2014-0063799, filed May 27, 2014 and KR 10-2015-0071741, filed May 22, 2015, which are hereby incorporated by reference in their entirety into this application.

BACKGROUND OF THE INVENTION

1. Technical Field

The present invention relates to a conductive polymeric ink composition and, more particularly, to a conductive polymeric ink composition having superior coatability (processability) and conductivity.

2. Description of the Related Art

PEDOT:PSS (Poly(3,4-ethylenedioxythiophene):poly(styrenesulfonate)) is actively utilized in photoelectronic organic devices and so on because of high electrical conductivity and transparency thereof. In particular, PEDOT:PSS films may be applied to touch screens, organic light emitting diodes, and e-papers. To this end, many attempts have been made to increase conductivity thereof using dimethyl sulfoxide, sorbitol, ionic liquids, and surfactants.

Meanwhile, a process of forming a uniform PEDOT:PSS film may be performed using various coating methods, for example, spin coating, bar coating, slot die coating, gravure printing, inkjet printing, spraying, off-set printing, etc. In order to apply such a composition to a printing process, a PEDOT:PSS ink composition has to possess coatability by the addition of an organic solvent. Although a PEDOT:PSS ink composition applicable to a printing process may be prepared by adding ink with a solvent having a high boiling point (bp: 100° C. or more), conductivity of the resulting coating film may decrease, which is undesirable. In particular, in an inkjet printing process, addition of a solvent having a high boiling point may increase jetting capability and spreadability of ink but may undesirably decrease conductivity.

Therefore, there is a need for an ink composition that satisfies both conductivity and coatability (processability).

SUMMARY OF THE INVENTION

Accordingly, the present invention has been made keeping in mind the problems encountered in the related art, and an object of the present invention is to provide an ink composition having superior coatability (processability) and conductivity.

In order to accomplish the above object, the present invention provides a conductive polymeric ink composition, comprising: 1) PEDOT:PSS (poly(3,4-ethylenedioxythiophene):poly(styrenesulfonate)) aqueous dispersion; 2) dimethyl sulfoxide (DMSO); 3) a solvent; 4) a surfactant; and 5) a phosphate compound represented by Chemical Formula 1 below.

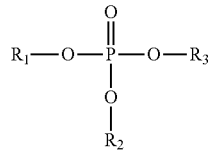

<Chemical Formula 1>

In Chemical Formula 1, $R_1$, $R_2$ and $R_3$ are each independently selected from the group consisting of C1-C20 linear or branched alkyl, C1-C20 linear or branched alkenyl, C5-C60 cycloalkyl, C5-C60 cycloalkenyl, and C1-C20 carbonyl, wherein when $R_1$, $R_2$ and $R_3$ are substituted with a substituent, the substituent is selected from the group consisting of a C1-C30 alkyl group, a C2-C40 vinyl group, a C6-C40 aryl group, a halogen group, an OH (hydroxyl) group, a carbonyl group, a C1-C30 alkoxy group, a C1-C30 alkoxycarbonyl group, an epoxy group, and a C3-C40 heterocycloalkyl group.

In addition, the present invention provides a transparent electrode, comprising a transparent conductive polymer thin film formed using the ink composition as above.

According to the present invention, the use of an ink composition enables the formation of a conductive polymer thin film, which is superior in coatability or processability, including jetting capability, spreadability on a substrate, and also has high transmittance and conductivity.

According to the present invention, the transparent conductive polymer thin film obtained using the ink composition can exhibit high conductivity, and can thus be utilized for a transparent electrode, instead of ITO, and can also be employed in an electrode layer or a buffer layer (a hole transport layer) of an organic photovoltaic cell.

DESCRIPTION OF THE SPECIFIC EMBODIMENTS

Figure 1:
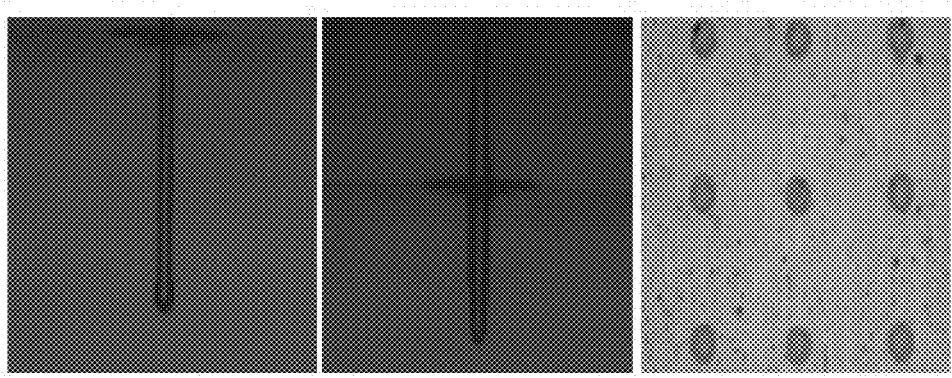
FIG. 1 illustrates jetting images of an ink composition of Example 1, in which a drop of ink drips from the upper nozzle.

Hereinafter, a detailed description will be given of the present invention.

An aspect of the present invention addresses a conductive polymeric ink composition, comprising: 1) a PEDOT:PSS (poly(3,4-ethylenedioxythiophene):poly(styrenesulfonate)) aqueous dispersion, 2) dimethyl sulfoxide, 3) a solvent, 4) a surfactant, and 5) a phosphate compound represented by Chemical Formula 1 below.

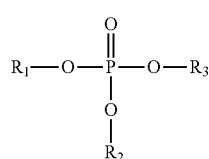

<Chemical Formula 1>

In Chemical Formula 1, $R_1$, $R_2$ and $R_3$ are each independently selected from the group consisting of C1-C20 linear or branched alkyl, C1-C20 linear or branched alkenyl, C5-C60 cycloalkyl, C5-C60 cycloalkenyl, and C1-C20 carbonyl, wherein when $R_1$, $R_2$ and $R_3$ are substituted with a substituent, the substituent is selected from the group consisting of a C1-C30 alkyl group, a C2-C40 vinyl group, a C6-C40 aryl group, a halogen group, an OH (hydroxyl) group, a carbonyl group, a C1-C30 alkoxy group, a C1-C30 alkoxycarbonyl group, an epoxy group, and a C3-C40 heterocycloalkyl group.

1) The PEDOT:PSS aqueous dispersion indicates a water-based dispersion solution including a PEDOT:PSS polymer or copolymer.

The amount of the PEDOT:PSS aqueous dispersion is preferably 10 to 60 wt %, and more preferably 20 to 40 wt %, based on the total weight of the ink composition. If the amount thereof is less than 10 wt %, it is difficult to ensure sufficient conductivity attributable to the use of a very small amount of PEDOT:PSS. In contrast, if the amount thereof exceeds 60 wt %, spreadability may become poor, undesirably making it difficult to form a uniform thin film and incurring poor jetting capability upon ink-jetting.

In a preferred embodiment of the present invention, PH-1000 made by Heraeus is used as the PEDOT:PSS aqueous dispersion.

2) Dimethyl sulfoxide (DMSO) is added to improve conductivity of the ink composition, and the amount thereof is preferably 0.5 to 3.0 wt % based on the total weight of the ink composition. If the amount thereof is less than 0.5 wt %, there are no improvements in conductivity. In contrast, if the amount thereof exceeds 3.0 wt %, the resulting ink may have low conductivity and low stability.

3) The solvent may include a) deionized water (DI water) and b) polyhydric alcohol.

a) DI water functions to disperse the PEDOT:PSS aqueous dispersion, and the amount thereof is preferably 10 to 60 wt % based on the total weight of the ink composition. If the amount of DI water exceeds 60 wt % based on the total weight of the ink composition, the resulting ink has high surface tension, and thus is not effectively spread on a substrate, and it is difficult to perform a jetting process. In contrast, if the amount thereof is less than 10 wt %, the resulting ink has high viscosity and is thus unsuitable for use in ink-jetting.

b) The polyhydric alcohol may include, but is not necessarily limited to, diethylene glycol, ethylene glycol, propylene glycol, glycerol, and sorbitol. Preferably useful is propylene glycol or glycerol.

The polyhydric alcohol is contained in the solvent to increase conductivity and dispersibility of the ink composition. The amount thereof is preferably 5 to 45 wt % based on the total weight of the ink composition. If the amount thereof exceeds 45 wt %, conductivity may decrease. In contrast, if the amount thereof is less than 5 wt %, there are no improvements in conductivity.

In another embodiment of the present invention, the ink composition may further comprise an additional solvent to improve conductivity of the ink composition.

The additional solvent may include, but is not necessarily limited to, methanol, ethanol, and propanol.

The amount of the additional solvent is preferably 1.0 to 10 wt % based on the total weight of the ink composition. If the amount thereof exceeds 10 wt %, conductivity may decrease. In contrast, if the amount thereof is less than 1.0 wt %, there are no improvements in conductivity.

4) The surfactant is added to enhance spreadability of the ink composition, and the amount thereof is preferably 0.01 to 3.0 wt % based on the total weight of the ink composition. If the amount thereof is less than 0.01 wt %, spreadability cannot be obtained as desired. In contrast, if the amount thereof exceeds 3.0 wt %, conductivity of the ink may decrease.

The surfactant preferably includes, but is not limited to, a nonionic surfactant, especially a fluorine-based surfactant.

5) The phosphate compound is added to increase processability of the ink composition, including jetting capability, spreadability on a substrate, etc., and may be represented by Chemical Formula 1 below.

<Chemical Formula 1>

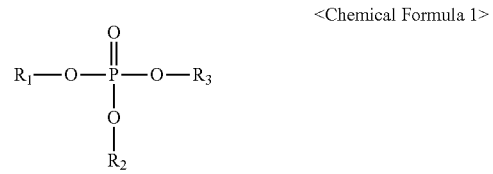

In Chemical Formula 1, $R_1$, $R_2$ and $R_3$ are each independently selected from the group consisting of C1-C20 linear or branched alkyl, C1-C20 linear or branched alkenyl, C5-C60 cycloalkyl, C5-C60 cycloalkenyl, and C1-C20 carbonyl, wherein when $R_1$, $R_2$ and $R_3$ are substituted with a substituent, the substituent is selected from the group consisting of a C1-C30 alkyl group, a C2-C40 vinyl group, a C6-C40 aryl group, a halogen group, an OH (hydroxyl) group, a carbonyl group, a C1-C30 alkoxy group, a C1-C30 alkoxycarbonyl group, an epoxy group, and a C3-C40 heterocycloalkyl group.

As such, $R_1$, $R_2$ and $R_3$ each may be any one selected from among groups represented by the following structural formulas, but are not limited thereto.

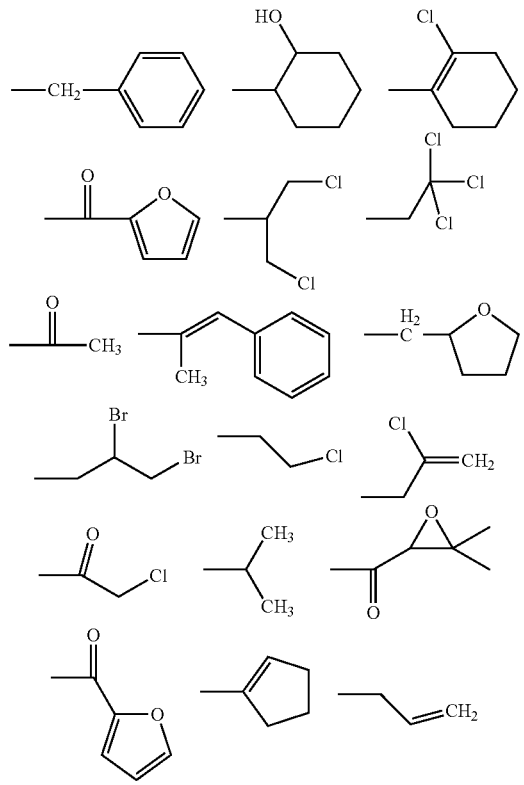

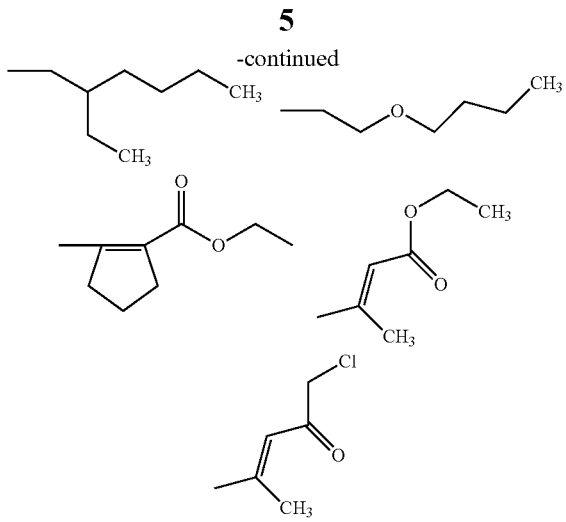

The amount of the phosphate compound is preferably 0.5 to 20 wt %, and more preferably 5 to 15 wt %, based on the total weight of the ink composition. If the amount thereof is less than 0.5 wt %, processing properties and spreadability on a substrate cannot be obtained as desired. In contrast, if the amount thereof exceeds 20 wt %, conductivity of the ink may decrease.

Preferred examples of the phosphate compound include, but are not necessarily limited to, triethyl phosphate, tris(2-ethylhexyl)phosphate, and trimethyl phosphate.

Typical examples of a process of forming a PEDOT:PSS thin film on a substrate using the ink composition according to the present invention may include bar coating, spin coating, inkjet printing, and spray coating. Particularly useful is inkjet printing because it is possible to perform direct patterning on a desired position using a small amount of material.

The ink composition according to the present invention, including the phosphate compound, may exhibit superior jetting capability and high spreadability on a substrate, and thereby may be properly utilized for inkjet printing.

In addition, a transparent conductive polymer thin film formed using the ink composition according to the present invention is significantly improved in transmittance and also conductivity of the PEDOT:PSS thin film.

Another aspect of the present invention addresses a transparent electrode, comprising a transparent conductive polymer thin film formed using the ink composition as above.

A further aspect of the present invention addresses an organic photovoltaic cell, comprising the above transparent conductive polymer thin film, as a buffer layer or an electrode layer.

A better understanding of the present invention may be obtained via the following examples.

Example 1

32.9 wt % of PH-1000 (made by Heraeus) as a PEDOT:PSS aqueous dispersion, 1.6 wt % of DMSO, 32.7 wt % of DI water, and 19.6 wt % of propylene glycol were mixed.

Subsequently, 0.1 wt % of a surfactant F-555 (made by DIC), and 13.1 wt % of triethyl phosphate were added, and the resulting mixture was stirred for 2 hr, yielding an ink composition.

Example 2

An ink composition was prepared in the same manner as in Example 1, with the exception that tris(2-ethylhexyl)phosphate was used, instead of triethyl phosphate.

Example 3

An ink composition was prepared in the same manner as in Example 1, with the exception that trimethyl phosphate was used, instead of triethyl phosphate.

Comparative Example 1

32.8 wt % of PH-1000, 1.6 wt % of DMSO, 31.1 wt % of DI water, 12.4 wt % of butyl cellosolve, 18.7 wt % of propylene glycol, and 3.3 wt % of glycerol were mixed.

Subsequently, 0.1 wt % of F-555 was added, and the resulting mixture was stirred for 2 hr, yielding an ink composition.

Comparative Example 2

32.8 wt % of PH-1000, 1.6 wt % of DMSO, 37.30 wt % of DI water, 24.9 wt % of propylene glycol, and 3.3 wt % of glycerol were mixed.

Subsequently, 0.1 wt % of F-555 was added, and the resulting mixture was stirred for 2 hr, yielding an ink composition.

Preparation Example 1

Each of the ink compositions of Example 1 and Comparative Examples 1 and 2 was subjected to spin coating (500 rpm, 9 sec), and then dried on a hot plate at 120° C./30 min, thus forming individual PEDOT:PSS thin films.

<Evaluation of Properties of Ink Composition>

Evaluation of Jetting Capability, Contact Angle, and Drop Size

The jetting capability of the ink compositions of Example 1 and Comparative Examples 1 and 2 was evaluated. For this, an inkjet printer (UJ 200) made by Unijet, with SL-128/80 head, was used (Nozzle number: 128, Drop volume: 80 pL). The case where continuous jetting is possible was evaluated by ○, the case where initial jetting is good but over time becomes poor was evaluated by Δ, and the case where initial jetting is poor was evaluated by X. The results are shown in Table 1 below.

Also, one drop of the ink composition of each of Example 1 and Comparative Examples 1 and 2 was jetted on a PET film, and the drop size was measured. The results are shown in Table 1 below.

Also, 0.3 μL of the ink was dropped on a glass substrate, and the contact angle thereof was measured. The results are shown in Table 1 below. A low contact angle means good spreadability on a substrate.

<Evaluation of Properties of Thin Film>

The PEDOT:PSS thin films of Preparation Example 1 were measured for surface resistance using a 4-point-probe. The results are shown in Table 1 below.

Also, transmittance of the thin films was measured.

TABLE 1

| | Transmittance (%) | Surface resistance (Ω/) | Contact angle | Jetting capability | Drop size (μm) |
|---|---|---|---|---|---|
| Ex. 1 | 89.22 | 269 | 6.4 | ○ | 143 |
| Ex. 2 | 91.05 | 483 | 10.4 | ○ | 128 |
| Ex. 3 | 90.28 | 409.2 | 8.2 | ○ | 135 |
| C. Ex. 1 | 89.22 | 508 | 6.4 | ○ | 119 |
| C. Ex. 2 | 89.37 | 263 | 17.4 | X | X |

As is apparent from Table 1, the ink composition of Comparative Example 2 exhibited poor jetting capability and thus did not form a drop, and it could not be spread on a substrate well.

Also, the thin film formed using the ink composition of Comparative Example 1 had high surface resistance, and thus exhibited low conductivity.

However, the ink composition of Example 1 according to the present invention manifested superior jetting capability and thus was efficiently spread on a substrate. The thin film formed using the ink composition of Example 1 had low surface resistance and high transmittance.

In particular, the ink compositions of Examples 2 and 3 manifested a transmittance of about 90~91% and a surface resistance of about 400~500 Ω/.

Figure 2:
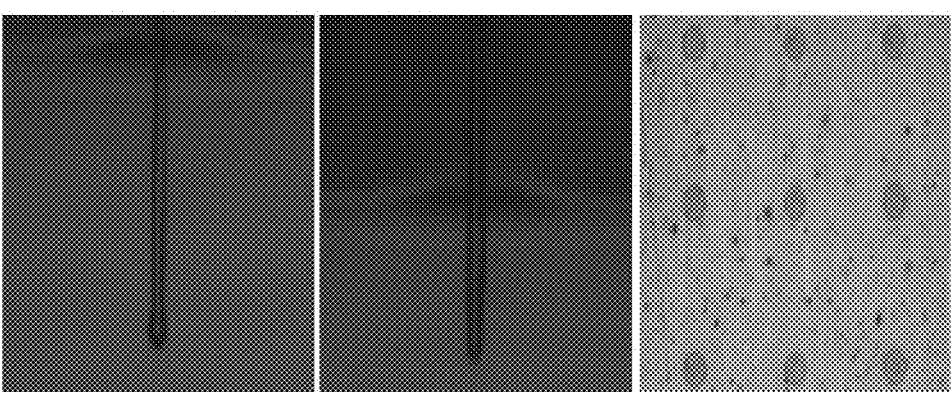
FIG. 2 illustrates jetting images of an ink composition of Comparative Example 1.

FIG. 1 illustrates jetting images of the ink composition of Example 1, and FIG. 2 illustrates jetting images of the ink composition of Comparative Example 1. As illustrated in FIGS. 1 and 2, it can be seen that the ink was provided in the form of a drop and dripped well from the nozzle when using the ink compositions of Example 1 and Comparative Example 1.

Figure 3:
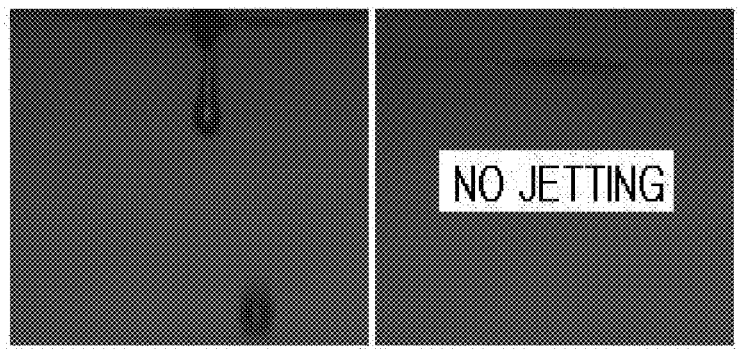
FIG. 3 illustrates jetting images of an ink composition of Comparative Example 2.

FIG. 3 illustrates jetting images of the ink composition of Comparative Example 2. As illustrated in FIG. 3, when using the ink composition of Comparative Example 2, the ink was not provided in the form of a drop upon jetting. In the case where the jetting process was continued, the nozzle was plugged as shown in the right image, making it impossible to jet the ink.

Based on the above evaluation results, according to the present invention, the ink composition having high processability suitable for use in an inkjet printing process can be prepared, and a transparent conductive polymer uniform thin film having high transmittance and conductivity can be manufactured therefrom.

What is claimed is:

1. A conductive polymeric ink composition, comprising:
   1) a PEDOT:PSS (poly(3,4-ethylenedioxythiophene):poly(styrenesulfonate)) aqueous dispersion,
   2) dimethyl sulfoxide,
   3) a solvent,
   4) a surfactant, and
   5) a phosphate compound represented by Chemical Formula 1 below:

<Chemical Formula 1>

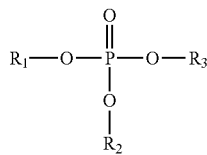

in Chemical Formula 1, $R_1$, $R_2$ and $R_3$ are each independently selected from the group consisting of C1-C20 linear or branched alkyl, C1-C20 linear or branched alkenyl, C5-C60 cycloalkyl, C5-C60 cycloalkenyl, and C1-C20 carbonyl, wherein when $R_1$, $R_2$ and $R_3$ are substituted with a substituent, the substituent is selected from the group consisting of a C1-C30 alkyl group, a C2-C40 vinyl group, a C6-C40 aryl group, a halogen group, an OH (hydroxyl) group, a carbonyl group, a C1-C30 alkoxy group, a C1-C30 alkoxycarbonyl group, an epoxy group, and a C3-C40 heterocycloalkyl group.

2. The conductive polymeric ink composition of claim 1, wherein 1) the PEDOT:PSS (poly(3,4-ethylenedioxythiophene):poly(styrenesulfonate)) aqueous dispersion is used in an amount of 10 to 60 wt % based on a total weight of the ink composition.

3. The conductive polymeric ink composition of claim 1, wherein 2) the dimethyl sulfoxide (DMSO) is used in an amount of 0.5 to 3.0 wt % based on a total weight of the ink composition.

4. The conductive polymeric ink composition of claim 1, wherein 3) the solvent comprises a) deionized water and b) polyhydric alcohol.

5. The conductive polymeric ink composition of claim 4, wherein a) the deionized water is used in an amount of 10 to 60 wt % based on a total weight of the ink composition.

6. The conductive polymeric ink composition of claim 4, wherein b) the polyhydric alcohol is used in an amount of 5 to 45 wt % based on a total weight of the ink composition.

7. The conductive polymeric ink composition of claim 4, wherein 3) the solvent further comprises an additional solvent, including methanol, ethanol, or propanol.

8. The conductive polymeric ink composition of claim 7, wherein the additional solvent is used in an amount of 1.0 to 10 wt % based on a total weight of the ink composition.

9. The conductive polymeric ink composition of claim 1, wherein 4) the surfactant is used in an amount of 0.01 to 3.0 wt % based on a total weight of the ink composition.

10. The conductive polymeric ink composition of claim 1, wherein 5) the phosphate compound is used in an amount of 0.5 to 20 wt % based on a total weight of the ink composition.

11. The conductive polymeric ink composition of claim 1, wherein $R_1$, $R_2$ and $R_3$ each are any one selected from among groups represented by the following structural formulas

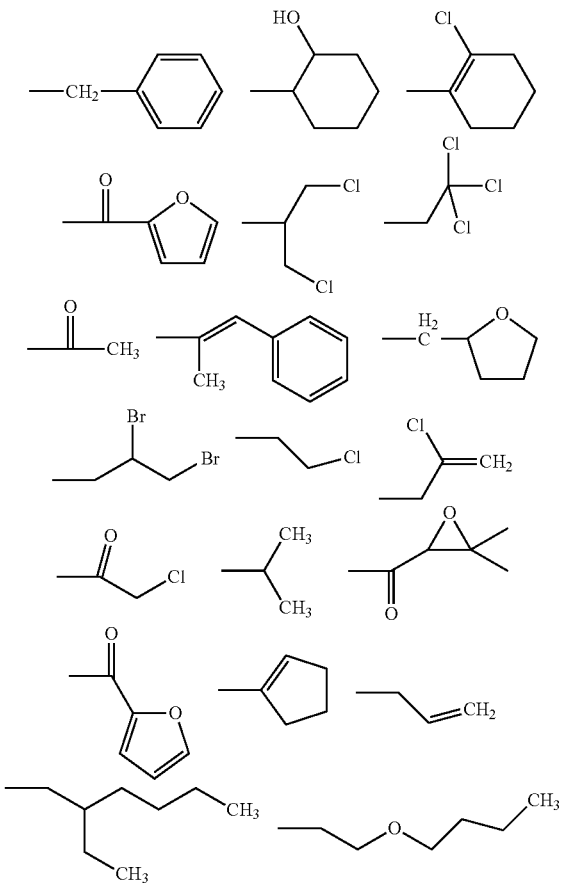

-continued

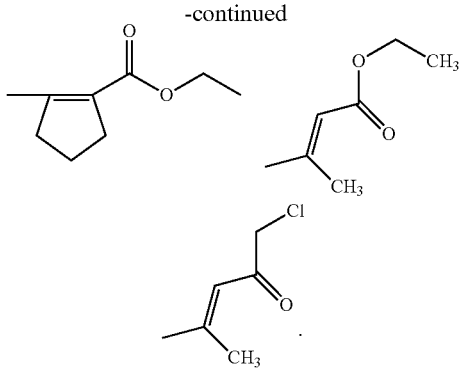

12. The conductive polymeric ink composition of claim 1, which is formed into a transparent conductive polymer thin film by inkjet printing.

13. A transparent electrode, comprising a transparent conductive polymer thin film formed using the ink composition of claim 1.

14. An organic photovoltaic cell, comprising a transparent conductive polymer thin film formed using the ink composition of claim 1, as a buffer layer or an electrode layer.

* * * * *